(12) United States Patent
Horch et al.

(10) Patent No.: US 6,911,680 B1
(45) Date of Patent: Jun. 28, 2005

(54) SELF-ALIGNED THIN CAPACITIVELY-COUPLED THYRISTOR STRUCTURE

(75) Inventors: Andrew Horch, Sunnyvale, CA (US); Scott Robins, San Jose, CA (US); Farid Nemati, Menlo Park, CA (US)

(73) Assignee: T-RAM, Inc., San Jose, CA (US)

( * ) Notice: Subject to any disclaimer, the term of this patent is extended or adjusted under 35 U.S.C. 154(b) by 0 days.

(21) Appl. No.: 10/890,031

(22) Filed: Jul. 13, 2004

Related U.S. Application Data

(63) Continuation of application No. 10/262,770, filed on Oct. 1, 2002, now Pat. No. 6,767,770.

(51) Int. Cl.[7] .............................................. H01L 29/74
(52) U.S. Cl. ....................... 257/162; 257/107
(58) Field of Search ................. 257/107, 133, 257/144, 163, 110, 120, 141, 162; 438/133, 134, 135, 181, 231

(56) References Cited

U.S. PATENT DOCUMENTS

| | | |
|---|---|---|
| 5,204,541 A | 4/1993 | Smayling et al. |
| 5,208,472 A | 5/1993 | Su et al. |
| 5,240,865 A | 8/1993 | Malhi |
| 5,436,482 A | 7/1995 | Ogoh |
| 5,463,231 A | 10/1995 | Ogura et al. |
| 5,472,887 A | 12/1995 | Hutter et al. |
| 5,705,439 A | 1/1998 | Chang |
| 5,714,774 A | 2/1998 | Otsuki et al. |
| 5,759,897 A | 6/1998 | Kadosh et al. |
| 5,895,955 A | 4/1999 | Gardner et al. |
| 5,905,293 A | 5/1999 | Jeng et al. |
| 5,920,103 A | 7/1999 | Fulford et al. |
| 5,965,464 A | 10/1999 | Tsai et al. |
| 6,020,242 A | 2/2000 | Tsai et al. |
| 6,124,610 A | 9/2000 | Cheek et al. |
| 6,168,999 B1 | 1/2001 | Ziang et al. |
| 6,191,462 B1 | 2/2001 | Chen-Hua |
| 6,229,161 B1 | 5/2001 | Nemati et al. |
| 6,462,359 B1 | 10/2002 | Nemati et al. |
| 6,512,275 B1 | 1/2003 | Hsu et al. |
| 6,521,487 B1 | 2/2003 | Chen et al. |
| 2002/0093030 A1 | 7/2002 | Hsu et al. |
| 2002/0100918 A1 | 8/2002 | Hsu et al. |
| 2002/0109150 A1 * | 8/2002 | Kajiyama ................... 257/107 |

* cited by examiner

*Primary Examiner*—Matthew Smith
*Assistant Examiner*—Lex H. Malsawma

(57) ABSTRACT

A semiconductor memory device having a thyristor is manufactured in a manner that makes possible self-alignment of one or more portions of the thyristor. According to an example embodiment of the present invention, a gate is formed over a first portion of doped substrate. The gate is used to mask a portion of the doped substrate and a second portion of the substrate is doped before or after a spacer is formed. After the second portion of the substrate is doped, the spacer is then formed adjacent to the gate and used to mask the second portion of the substrate while a third portion of the substrate is doped. The gate and spacer are thus used to form self-aligned doped portions of the substrate, wherein the first and second portions form base regions and the third portion form an emitter region of a thyristor. In another implementation, the spacer is also adapted to prevent formation of salicide on the portion of the thyristor beneath the spacer, self-aligning the salicide to the junction between the second and third portions. In addition, dimensions such as width and other characteristics of the doped portions that are used to form a thyristor can be controlled without necessarily using a separate mask.

7 Claims, 7 Drawing Sheets

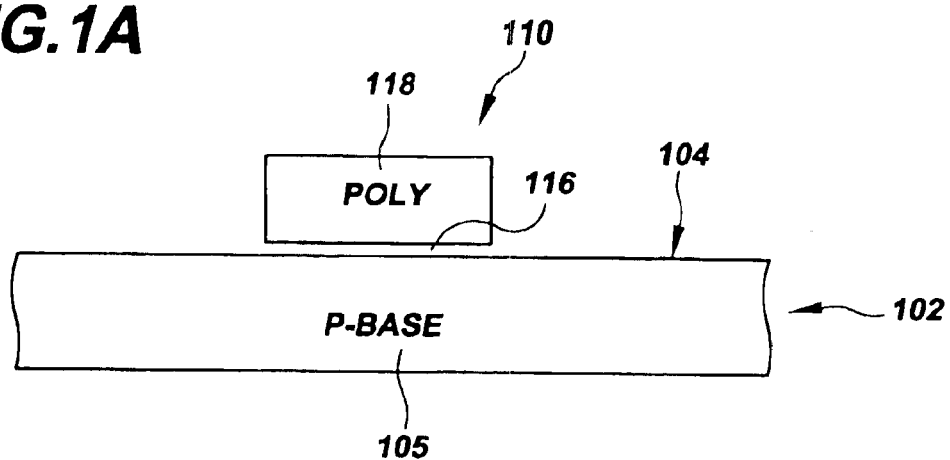
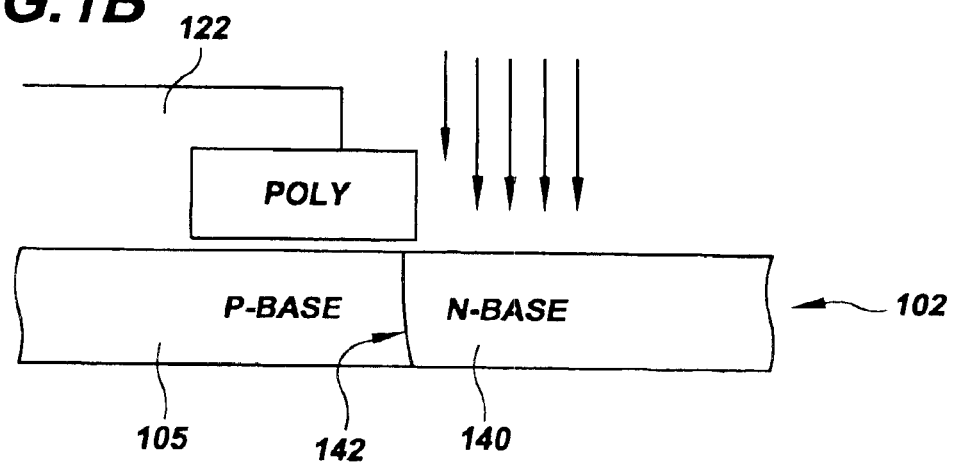
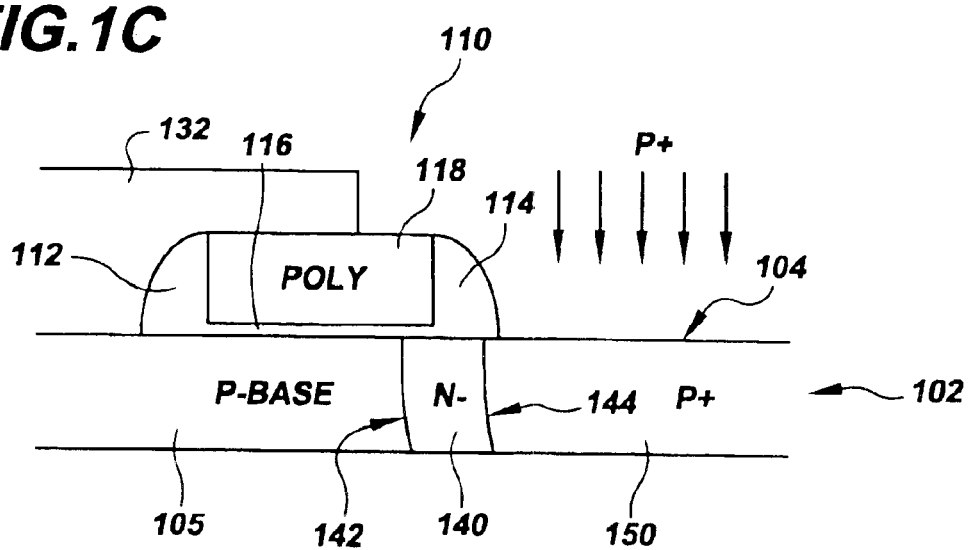

SELF-ALIGNED THIN CAPACITIVELY-COUPLED THYRISTOR STRUCTURE

RELATED APPLICATION

This is a continuation of patent application Ser. No. 10/262,770, filed Oct. 1, 2002, now U.S. Pat No. 6,767,770. This parent application is incorporated herein by reference.

FIELD OF THE INVENTION

The present invention is directed to semiconductor devices and, more specifically, to semiconductor devices including thyristor-based devices.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the circuit design, construction, and manufacture of semiconductor devices concerns semiconductor memories and other circuitry used to store information. Conventional random access memory devices include a variety of circuits, such as SRAM and DRAM circuits. The construction and formation of such memory circuitry typically involves forming at least one storage element and circuitry designed to access the stored information.

There are a number of semiconductor memories in widespread use. Two such semiconductor memories are SRAM and DRAM. DRAM is very common due to its high density (e.g., high density has benefits including low price). DRAM cell size is typically between 6 $F^2$ and 8 $F^2$, where F is the minimum feature size. However, with typical DRAM access times being about 50 nSec, DRAM is relatively slow compared to typical microprocessor speeds and requires refresh. SRAM is another common semiconductor memory that is much faster than DRAM and, in some instances, is an order of magnitude faster than DRAM. Also, unlike DRAM, SRAM does not require refresh. SRAM cells are typically made using 4 transistors and 2 resistors or 6 transistors, which result in much lower density and is typically between about 60 $F^2$ and 100 $F^2$.

Various SRAM cell designs based on NDR (Negative Differential Resistance) constructions have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for the cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in overcoming many previously unresolved problems for memory applications. An important consideration in the design of the thin capacitively-coupled thyristor involves designing the body of the thyristor sufficiently thin, so that the capacitive coupling between the control port and the thyristor base region can substantially modulate the potential of the base region. For memory-cell applications, another important consideration in semiconductor device design, including those employing thin capacitively-coupled thyristor-type devices, includes forming devices in a very dense array.

NDR devices including thyristors are also widely used in power switching applications because the current densities carried by such devices can be very high in their on state. In typical power applications, high voltages force thyristor devices to be very large. In some cases, the entire wafer is used to make one thyristor (e.g., no logic devices are combined with the thyristor). The performance of such NDR devices is dependent on many physical parameters, including the length of various regions of the thyristor. One manner for forming regions to a selected length includes using a masking technique such as photolithography. On very large thyristors, diffusion and/or epitaxial grown layer (s) may also be used. However, variation in the photolithographic process provided by currently-available photolithography techniques can hinder the ability to make one or more of the regions to a desired length and/or width, which can cause problems in some applications.

In high-density memory applications where high temperature diffusion steps can degrade logic devices and where photolithography is being used to produce the smallest features possible, traditional techniques used for fabricating thyristors, including those discussed above, do not work well. Specifically, additional length may be necessary for misalignment and process variation, which makes the device larger. The larger device may be acceptable for power thyristors, but not necessarily for devices such as high density memory cells. In addition, if a salicide block is also needed to prevent a salicide short between the regions of the thyristor, the length of the region being defined can be even longer (e.g., if the salicide block is also defined by photolithography, requiring additional space for misalignment). In a memory cell having mirrored thin capacitively-coupled thyristor elements, width variation aggravates the performance of the cell because misalignment can cause adjacent cells to have regions of different widths.

These and other design considerations have presented challenges to efforts to implement such a thin capacitively-coupled thyristor in bulk substrate applications, and in particular to highly dense applications.

SUMMARY

The present invention is directed to the manufacture of a thyristor in a manner that addresses the above-mentioned challenges. The present invention is exemplified in a number of implementations and applications, some of which are summarized below.

According to an example embodiment of the present invention, a gate and a spacer are used to mask portions of a semiconductor substrate for implanting the substrate with a dopant for forming a thyristor. A portion of the substrate is doped, and a thyristor gate is formed over a first region of the doped substrate. The gate is used to mask the first region and a second region of the substrate is doped. A sidewall spacer is formed adjacent to the gate over the second region and used to mask the second region while a third region of the substrate is doped. In the resulting structure, the first and third regions are each contiguously adjacent to the second region. The thyristor includes doped regions of which the first and second regions are base regions and the third region is an emitter region of the thyristor. The dimension of the second doped thyristor region is controlled using a spacer for self-alignment. If left in place, the sidewall spacer also acts to block the formation of self-aligned silicide (salicide) on the surface of the second doped thyristor region. In this manner, the alignment and definition of the second doped portion is facilitated.

In a related embodiment, a thyristor includes a capacitively-coupled control port and an underlying thyristor-body region being aligned so that the control port does not extend beyond one or both of the junction-defining edges.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which:

FIG. 1A shows a thyristor device at a relatively early stage of manufacture, according to an example embodiment of the present invention;

FIG. 1B shows the thyristor device of FIG. 1A after further manufacture, according to another example embodiment of the present invention;

FIG. 1C shows the thyristor device of FIG. 1B after further manufacture, according to another example embodiment of the present invention;

Figure 1D:
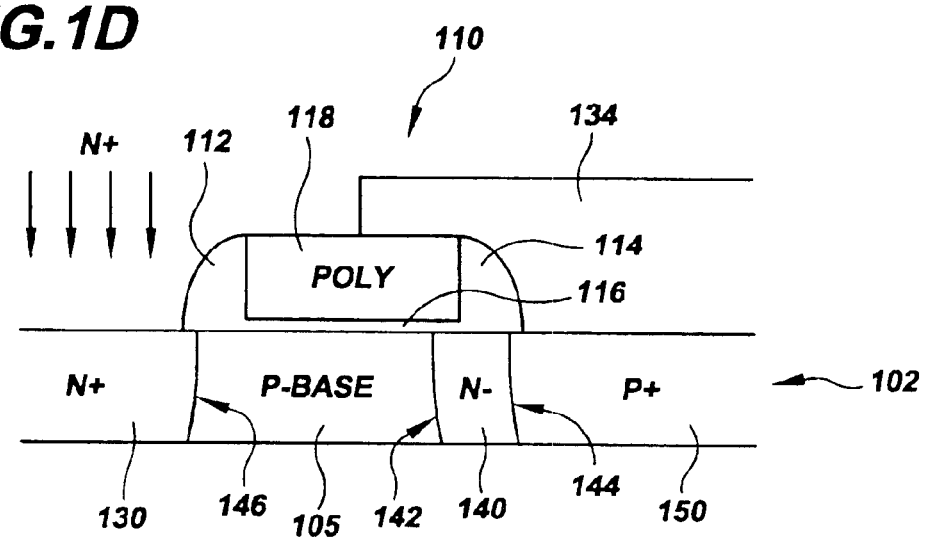
FIG. 1D shows the thyristor device of FIG. 1C after yet further manufacture, according to another example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for SOI (Silicon-on insulator) devices using thyristor-based devices, such as memory cells, and for enhancing the ability to form such devices. While the present invention is not necessarily limited to such devices, various aspects of the invention may be appreciated through a discussion of various examples using this context.

According to an example embodiment of the present invention, a thyristor is formed in a substrate using a control port and a spacer adjacent to the control port to mask one or more portions of the substrate for implantation. The implantation masked by the spacer results in a thyristor base region that is self-aligned to the control port and spacer edges, with the thyristor base region having a dimension defined as a function of the width of the spacer. In this manner, variation in the dimensions of the base that can occur using conventional formation methods, such as using a photolithographically defined layer to mask implantation of the thyristor base region, are reduced. The reduction in variation allows the formation of thyristor base regions that exhibit dimensions closer to design dimensions.

The approach discussed above is also useful, for example, in manufacturing mirrored thyristor devices having base regions with consistently smaller relative dimensions than can be manufactured using a photoresist mask during implantation for defining the dimensions. In addition, forming a thyristor in this manner is useful in high density applications, such as in memory applications where the thyristor is adapted for storing information.

In another example embodiment of the present invention, a spacer formation process used in forming a CMOS logic gate is used to form a thyristor as well. For example, the base region of a thyristor can be self-aligned to the CMOS logic spacer, as discussed above. The spacer size used in the CMOS logic gate is selected to meet specifications for the thyristor such that no adjustment in spacer size is required for self-aligning a region of the thyristor. In this instance, a control port is formed over a first base region of the thyristor, a second base region is implanted adjacent to the first base region below the control port, and a spacer is formed on the sidewall of the control port. The spacer has a width extending over the second base region and selected for defining a width of the second base region. An emitter region is formed self-aligned to the edge of the sidewall spacer.

FIGS. 1A through 1D show a thin capacitively coupled thyristor being manufactured, according to a more particular example embodiment of the present invention. In FIG. 1A, a gate structure 110 (e.g., a control port structure) is formed over a substrate 102 having a region 105 of P doping to be used to form a P-base region. The gate structure includes a gate dielectric 116 formed on an upper surface 104 of the substrate and polysilicon 118 formed on the dielectric. In FIG. 1B, a mask 122 (e.g., a photoresist) is formed over a portion of the gate structure 110 and of the upper surface 104 of the substrate 102. Using the mask 122 and the gate structure 110 to mask the substrate, an N-base region 140 is implanted adjacent to the P-base region 105, forming a p-n junction region 142. As discussed in connection with FIG. 3, the N-base region can be offset from the corner of the gate structure 110.

In FIG. 1C, the mask 122 is removed, spacers 112 and 114 are formed adjacent to the gate polysilicon 118 and dielectric 116, and a mask 132 is formed over the spacer 112 and over a portion of each of the upper surface 104 of the substrate 102 and the gate structure 110. A P+ implant is effected to form P+ region 150, using the spacer 114 to mask a portion of the N-base region 140. P+ region 150 and N-base region 140 form an anode end portion of the thyristor having a p-n junction 144 that, together with p-n junction 142, defines a width of the N-base region 140. In this manner, the N-base region 140, as defined by p-n junction 144, is self-aligned to the spacer 114.

Referring now to FIG. 1D, the mask 132 is removed after the P+ region is implanted and a mask 134 (e.g., a photoresist) is formed over the P+ region 150, the spacer 114 and the polysilicon gate 118. An N+ implant is effected to form N+ emitter region 130 that is adjacent to the P-base region 105. The N+ emitter region and the P-base regions form a p-n junction 146 and define a cathode end portion of the thyristor. The resulting thyristor has a body defined by the cathode end portion that includes the N+ emitter region 130 and the P-base region 105 and by the anode end portion that includes the N-base region 140 and P+ emitter region 150. The gate polysilicon 118 is capacitively coupled via the gate dielectric 116 to the P-base region 105 and forms a control gate for the thyristor.

Figure 1E:
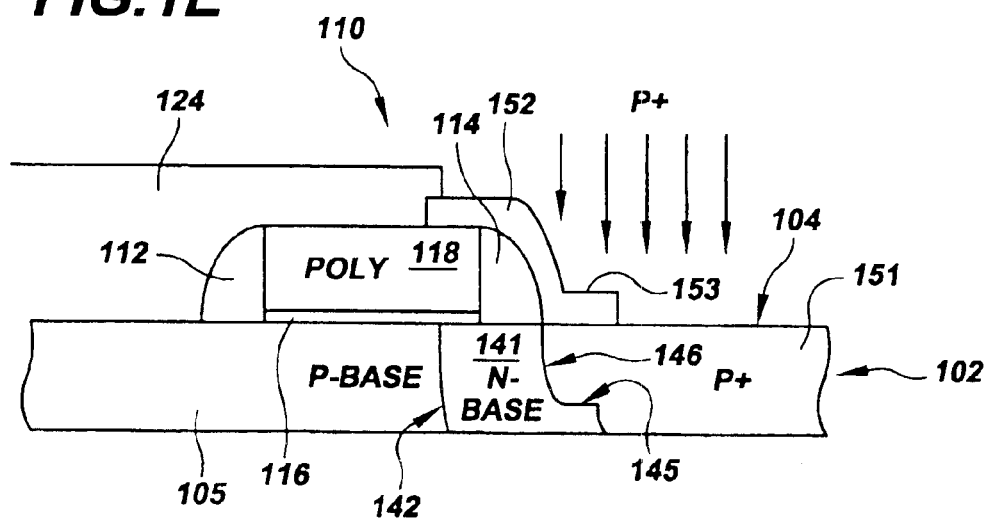
FIG. 1E shows a thyristor device undergoing manufacture, according to another example embodiment of the present invention.

In another example embodiment of the present invention, the size of the spacer used in a CMOS logic gate process is adjusted (e.g., increased) to selectively change the spacer size to meet specifications for use in forming a self-aligned portion of a thyristor. In one particular implementation, a thyristor is formed as shown in FIGS. 1A and 1B and as described above, wherein the thin capacitively-coupled thyristor undergoes further manufacturing as shown in FIG. 1E after the N-base region 141 is implanted. Spacers 112 and 114 are formed adjacent the polysilicon gate 118 and the gate dielectric 116. A layer of the spacer material is deposited and etched back (not shown) to form an additional spacer 152. The resulting spacer 152 is formed over a portion of the polysilicon 118, sidewall 114 and the upper surface 104. A mask 124 is then formed over a portion of the gate polysilicon 118, the spacer 112 and the N+ emitter region 130. A P+ implant is effected to form P+ region 151 using the spacer 152 and the mask 124 to mask a portion of the substrate such that the implant below these regions is inhibited. A portion 153 of the spacer layer that is formed on the upper surface 104 of the substrate is adapted to only partially inhibit the P+ implant, resulting in dopant passing through the spacer layer 153 and forming a laterally-extended portion 145 of the N-base. The thickness of the spacer layer portion 153 is selected for controlling the depth of the implant, depending upon the application. For example, a thicker spacer layer further inhibits the P+ doping and a thinner spacer layer allows more dopant to pass into the substrate. In other particular example embodiments, the various spacers are used to form the P-base region junctions at or to the outside of both edges of the overlying control port.

The resulting P+ emitter region below the spacer layer 153 is shallower than the P+ emitter region below the upper surface 104 not having spacer layer formed thereon. A p-n junction 146 between the P+ emitter region 151 and the N-base region 141, together with the p-n junction 142, define a width characteristic of the N-base region using the gate and spacer 152 for self-alignment. The N-base region 141 and the P+ emitter region 151 form an anode end portion of the thyristor. An N+ emitter region implant is carried out, such as shown in FIG. 1D, to complete the formation of the thyristor.

Thyristors formed in connection with the present invention can be implemented in a variety of manners, with selected examples discussed as follows. In one implementation, the P+ implant is effected using a relatively higher energy than used to effect the depth of the P+ region shown in FIG. 1E. In this implementation, the mask 124 is adapted to inhibit the P+ implant from implanting other portions of the substrate 102 while achieving a deeper implant through the portion 153 of the spacer layer. In another implementation, the doping of one or both of the N+ and P+ emitter regions is carried out concurrently with the formation of source/drain regions of other devices. In yet another implementation, the spacer 152 of FIG. 1E is formed as a symmetric spacer on both sides of the gate. In still another implementation, selected portions of the thyristor (e.g., the gate and the emitter regions) are salicided using the spacer 152 to block salicide formation over the N-base region 141 and to prevent the gate 118 and P+ emitter region 151 from shorting.

In another example embodiment of the present invention, the spacer and subsequent emitter region formation (using the spacer for self-alignment) is effected so that the spacer covers the junction between the base region over which the spacer is formed and the adjacent emitter region. This is particularly useful in processes with self-aligned silicide formation (salicide), so that salicide is prevented from shorting the junction between the second base region and the adjacent emitter.

Figure 2:
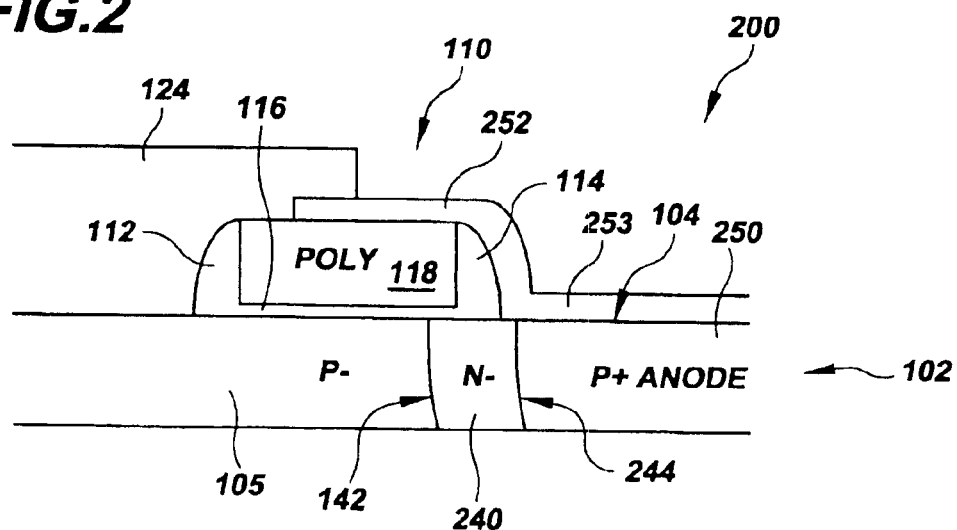
FIG. 2 shows a thyristor device manufactured in accordance with another example embodiment of the present invention.

In the following figures, similar features described in connection with other figures are similarly labeled, and selected discussion of similar features, where repetitive, has been omitted. FIG. 2 shows a thin capacitively-coupled thyristor device 200, according to another example embodiment of the present invention. After a dopant for the N-base is implanted, a spacer 252 is formed over the gate 110 and having a portion 253 over the upper surface 104 of the substrate. A P+ implant is used to form a P+ emitter 250 having a generally consistent depth, resulting in a p-n junction 244 defining the width of the N-base region adjacent to the P+ emitter. After the P+ implantation is carried out, the spacer 124 can be removed and an N+ region (not shown) can be formed 10 adjacent the P-base region 105, such as the N+ region 130 shown in FIG. 1D.

Figure 3:
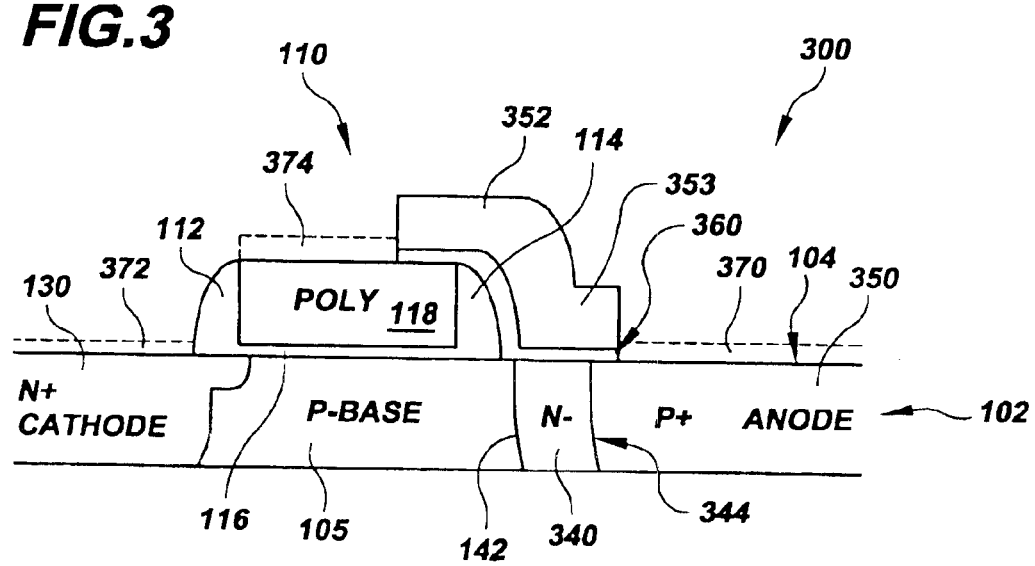
FIG. 3 shows a thyristor device manufactured in accordance with another example embodiment of the present invention.

FIG. 3 shows a thin capacitively-coupled thyristor 300 formed according to another example embodiment of the present invention. Spacer 352 is formed having a portion 353 over the upper surface 104 of the substrate. The thickness of portion 353 is selected to prohibit P+ implantation through this portion, thereby resulting in a wider N-base 340 than would exist if the P+ implant would pass through the spacer and into the substrate below the spacer.

In a more particular example embodiment of the present invention, an optional etch stop layer 360 (shown having been partially removed) is formed over the gate 110 and upper portion 104 of the substrate. The etch stop layer may be formed using a material including a nitride and/or other materials that prevent etching. A spacer layer (shown having been etched) used to form spacer 352 is formed over the etch stop. A mask (not shown) is formed over the portion of the layer 352 shown in FIG. 3 and the layer is etched to form the spacer 352. The etch stop layer prevents other portions of the thyristor and/or other circuitry from being etched during the etching of the spacer layer. The portion of the etch stop layer not under the layer 352 is then etched, leaving the etch stop structure 360 as shown.

In another example implementation that can be understood with reference to the illustrated implementation of FIG. 3, the spacer 352 is etched to expose the etch stop layer 360. Salicide portions 370, 372 and 374 (shown with dashed lines) are then formed, respectively, over the exposed upper surface of the substrate 104 over the P+ region 350, N+ region 130 and over the gate polysilicon 118. The etch stop layer 360 and the spacer 112 prevent the salicidation from shorting between the gate salicide 374 and either of the salicide portions 370 and 372.

Figure 4A:
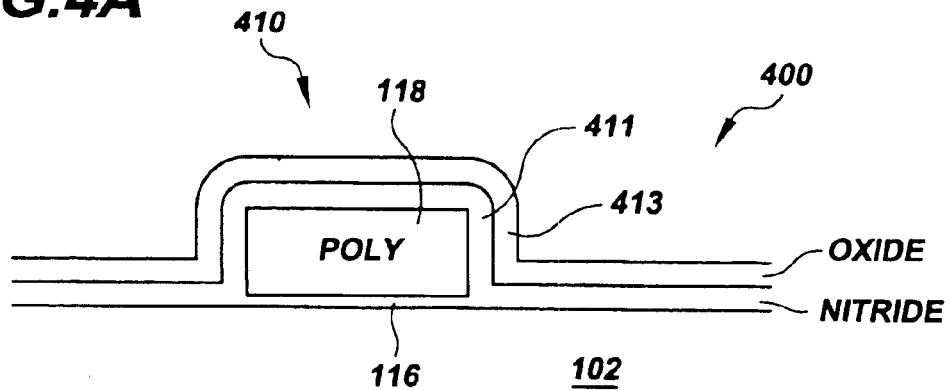
FIG. 4A shows another thyristor device at a relatively early stage of manufacture, according to another example embodiment of the present invention.
Figure 4B:
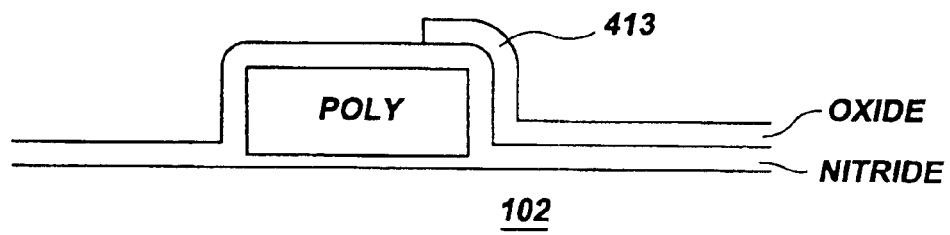
FIG. 4B shows the thyristor device of FIG. 4A after further manufacture, according to another example embodiment of the present invention.
Figure 4C:
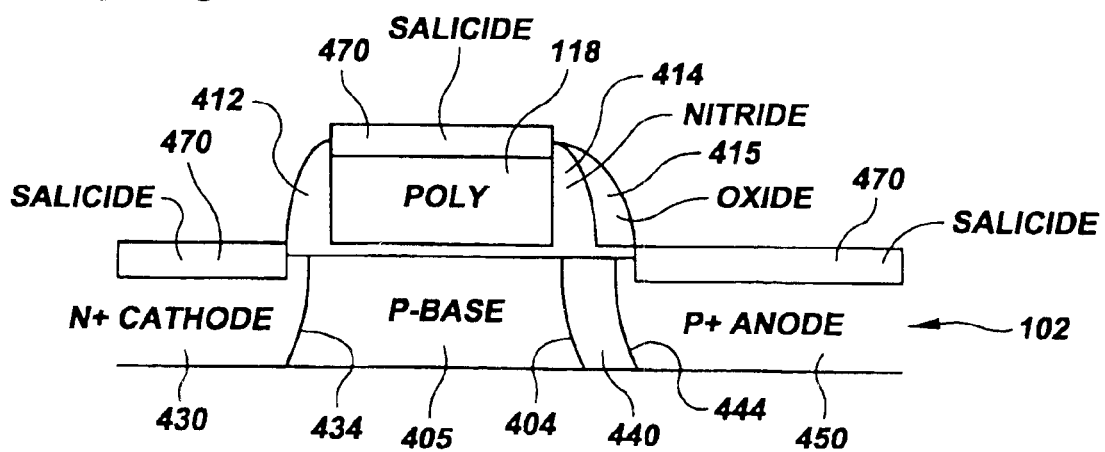
FIG. 4C shows the thyristor device of FIG. 4B after further manufacture, according to another example embodiment of the present invention.

FIGS. 4A–4C show a thin capacitively-coupled thyristor device 400 being formed, according to another example embodiment of the present invention. In FIG. 4A, an etch stop layer 411 is formed over a poly gate 118 and a gate dielectric 116 and over a substrate 102 after doping of P-base and N-base regions (not shown) in the substrate. A spacer layer 413 is formed on the etch stop layer, a photoresist is patterned on the spacer layer (not shown) and the spacer layer is etched, resulting in the structure 413 shown in FIG. 4B.

As shown in FIG. 4C, the spacer layer 413 is then selectively anisotropically etched to form spacer 415, and the etch stop layer is selectively anisotropically etched to form spacers 412 and 414. The N+ cathode region 430 is doped using the spacer 412 to define a width of the P-base at p-n junction 434. The spacers 414 and 415 are then used to mask a portion of the N-base during implantation of a P+ anode region 450, resulting in the N-base 440 having a width defined by p-n junction 444 (between the N-base and the P+ emitter) and p-n junction 404 (between the n-base region 440 and the p-base region 405). In addition, and applicable to each of the embodiments herein, an offset between the corner of poly gate 118 and the closest junction is achieved by either: forming N-base region 440 after the region 414 has been formed; or by angle implantation after the spacer 415 is formed. This offset is useful in that it increases the forward breakover voltage of the thyristor which, in turn, improves the temperature stability, and it improves the ability to transition the thyristor from a current-passing to current-blocking state. After the P+ emitter region is formed, a salicidation is effected to form salicide 470 over the N+ cathode 430, the poly gate 118 and the P+ anode 450, as shown. During the salicidation, the spacers 412 and 414 and the spacer 415 are used to prevent the formation of salicide over the N-base region 440 and over the p-n junctions 434 and 444 between the base and emitter regions of the thyristor.

Figure 5A:
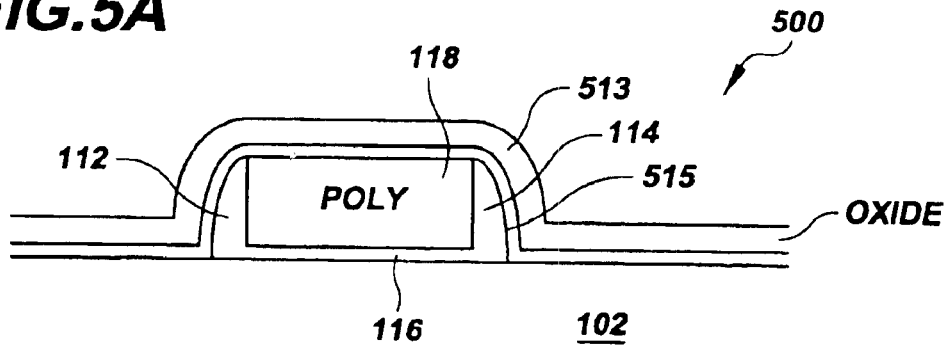
FIG. 5A shows a thyristor device at a relatively early stage of manufacture, according to yet another example embodiment of the present invention.
Figure 5B:
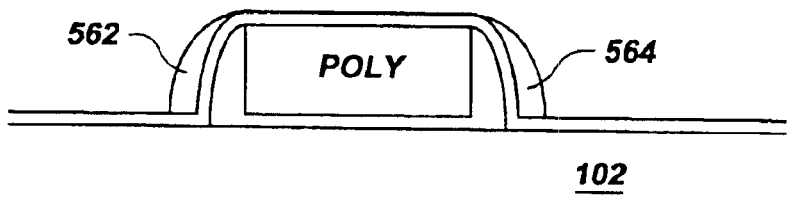
FIG. 5B shows the thyristor device of FIG. 5A after further manufacture, according to another example embodiment of the present invention.

FIGS. 5A–5D show a thin capacitively-coupled thyristor device 500 being manufactured, according to another example embodiment of the present invention. A P-base region 505 and an N-base region 540 (shown only in FIG. 5D for clarity) are formed in the substrate using, for example, methods such as those described above. In one implementation, the P-base region is formed during a P-well implant step, and the N-base region is formed during lightly doped drain (LDD) and/or S/D implants for other portions of the substrate. An etch stop layer 515 is formed over a poly gate 118 and a gate dielectric 116, spacers 112 and 114 and a substrate 102. A spacer layer 513 (e.g., oxide or other sufficiently-conformal material useful to form a spacer under-etch conditions) is formed over the etch stop layer, and is selectively anisotropically etched to form spacers 562 and 564, as shown in FIG. 5B.

Figure 5C:
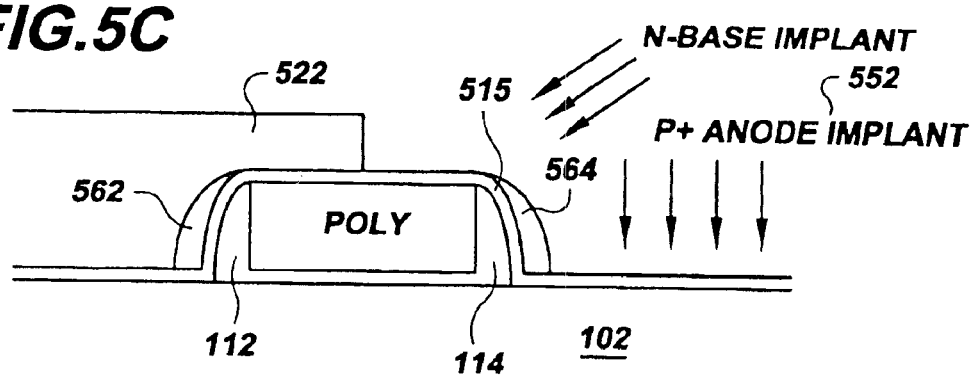
FIG. 5C shows the thyristor device of FIG. 5B after further manufacture, according to another example embodiment of the present invention.

In FIG. 5C, a photoresist 522 is patterned over a portion of the substrate, the spacer 562 and the etch stop layer 515. A P+ anode implant 552 is carried out using the spacer 564 to inhibit the P+ dopant below the spacer. After the P+ anode implant, the photoresist 522 and spacers 562 and 564 are removed, for example, using an isotropic etch with selectivity to etch stop layer 515.

Figure 5D:
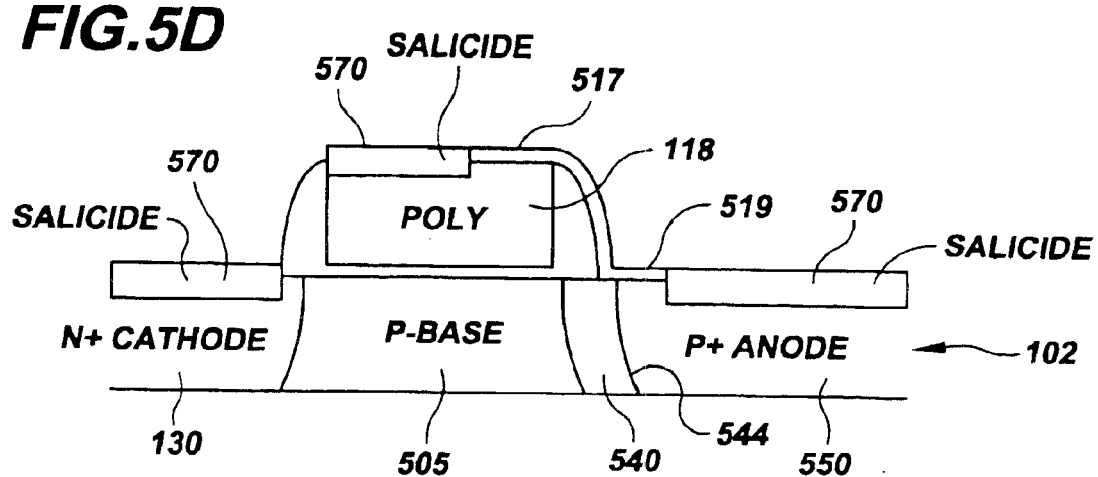
FIG. 5D shows the thyristor device of FIG. 5C after further manufacture, according to another example embodiment of the present invention.

FIG. 5D shows the resulting P+ anode emitter region 550 that defines a width of the N-base region 540 between p-n junction 544 and p-n junction 504. The etch stop layer 515 is masked and etched, leaving portions 517 and 519. A salicidation is then carried out to form salicide 570 over the N+ cathode 130, the poly gate 118 and the P+ anode emitter 550, as shown. The unetched etch stop regions 517 and 519 act as a salicide block.

Figure 6A:
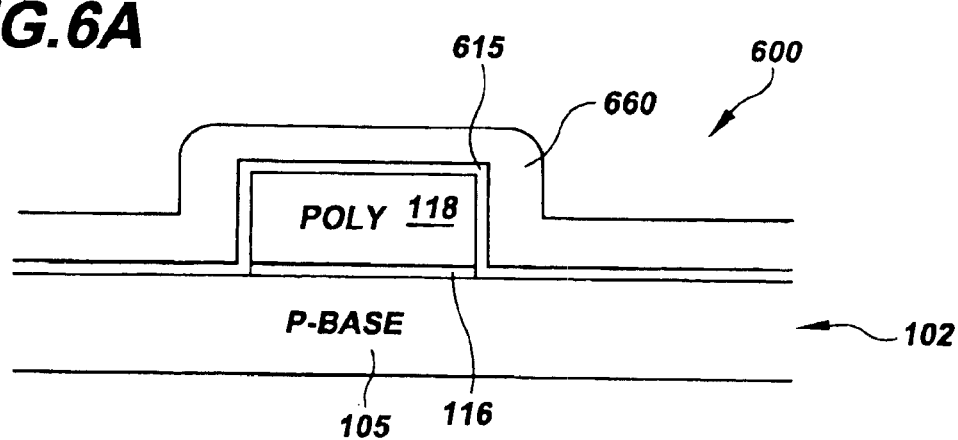
FIG. 6A shows another thyristor device at an early stage of manufacture, according to another example embodiment of the present invention.
Figure 6B:
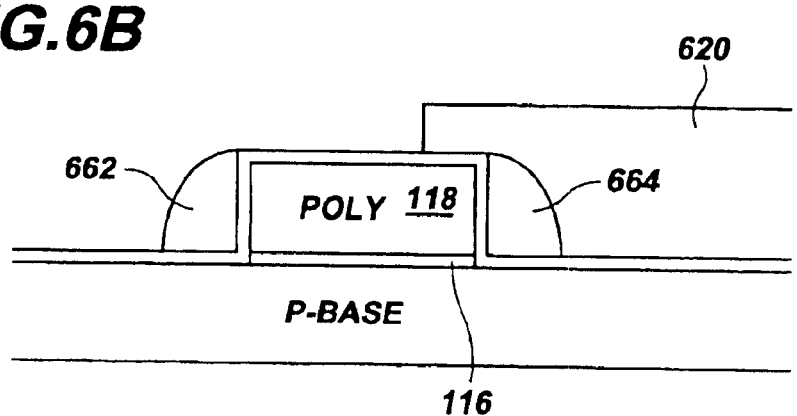
FIG. 6B shows the thyristor device of FIG. 6A after further manufacture, according to another example embodiment of the present invention.
Figure 6C:
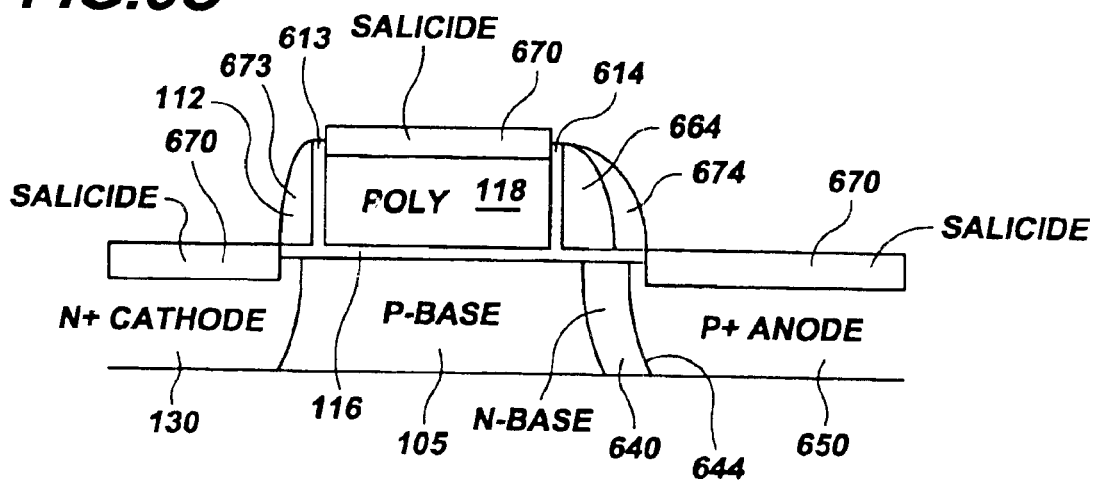
FIG. 6C shows the thyristor device of FIG. 6B after further manufacture, according to another example embodiment of the present invention.

FIGS. 6A–6C show a thin capacitively-coupled thyristor 600 being manufactured, according to another example embodiment of the present invention. In FIG. 6A, a thin etch stop layer 615 is formed over a poly gate 118, a gate dielectric 116 and a substrate 102. A spacer layer 660 is formed on the etch stop layer 615. In FIG. 6B, the spacer layer is selectively anisotropically etched, leaving portions 662 and 664. A mask 620, such as a photoresist, is then patterned as shown, and the spacer portion 662 is removed using, for example, an isotropic etch with high selectivity to the underlying etch stop layer 615.

In FIG. 6C, spacer portion 662 is removed and a second spacer layer is deposited and etched back to form spacers 674 and 673. The etch stop layer 615 is also etched back, leaving etch stops 613 and 614 adjacent to the thyristor gate sidewalls. An N+ cathode emitter region 130 is implanted using the spacer 673 to inhibit the N+ implant below the spacer. In addition, using the previously-discussed angled implant approach, a P+ anode emitter region 650 is implanted using the remaining portion 614 of the etch stop and the spacers 664 and 674 to inhibit the implant, and the N-base region 640 is formed having a width defined at p-n junction 644 between the N-base and the implanted P+ emitter regions. After the emitter regions are formed, salicide 670 is formed on the N+ emitter region 130, P+ emitter region 650 and poly gate region 118.

Figure 7A:
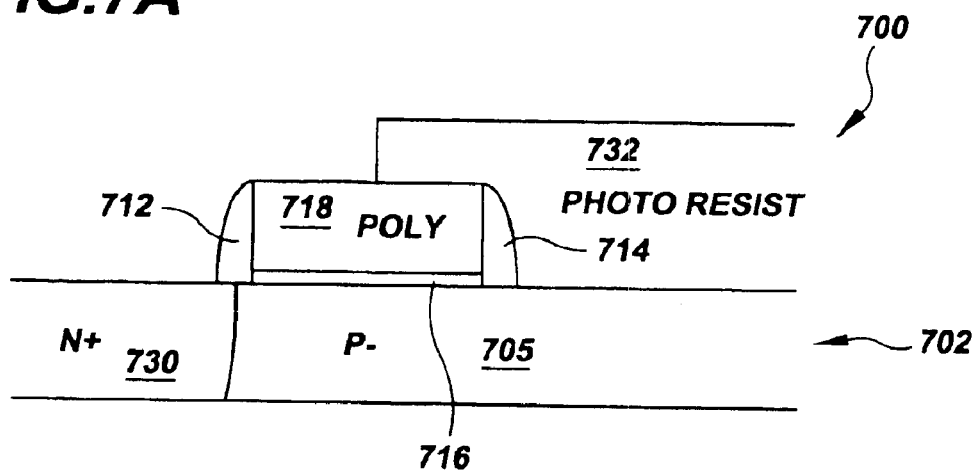
FIG. 7A shows another thyristor device at an early stage of manufacture, according to another example embodiment of the present invention.
Figure 7B:
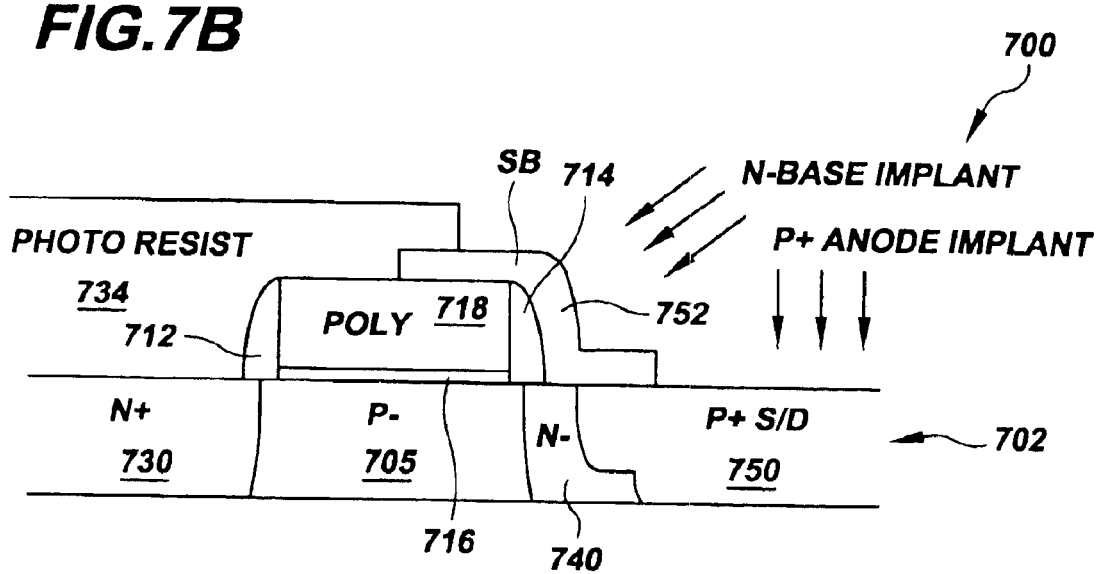
FIG. 7B shows the thyristor device of FIG. 6A after further manufacture, according to another example embodiment of the present invention.

FIGS. 7A–7B show a thin capacitively-coupled thyristor 700 being manufactured as an alternative approach to that shown in connection with FIG. 1E. In FIG. 7A, a control port stack including a control port 718 on a dielectric 716 and having sidewalls 712 and 714 is formed over a p-doped substrate 705 in a substrate region 702. A photoresist layer 732 is formed over the control port 718, spacer 714 and P-doped substrate 705. Using the photoresist layer 732 as a mask, N+ emitter region 730 is implanted in the substrate region 702 and aligned to the control port 718 and spacer 712.

In FIG. 7B, the photoresist material 732 has been removed and a salicide block layer 752 is formed on the control port 718, spacer 714 and substrate region 702. A photoresist layer 734 is formed over the salicide block layer 752, the control port 718, spacer 712 and N+ emitter region 730. An angled N-base implant is carried out to form N-base region 740 (at this later stage of the manufacturing process), and a P+ anode implant is carried out to form P+ emitter region 750, both using the salicide block as a mask.

As an alternative approach, any of the above embodiments can be modified using the approach(es) illustrated and described in concurrently-filed U.S. Provisional Patent Application Ser. No. 60/415,368 (TRAM.036P1), entitled "Implant Approach With Self-Alignment to Salicide Block."

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors; adding structures to the integrated circuit device; increasing the number of p-n sections in the thyristor-based memory device; and interchanging P and N regions in the device structures and/or using PMOSFETS or NMOSFETS in connection with the thyristors. In addition, it will be appreciated that use of the term "MOS" generally encompasses other FET-type semiconductor devices (IGFETs), for example, where oxide is not necessarily used. For more information regarding implementations to which the present invention is applicable and their respective operations and detailed construction, reference may be made to U.S. Pat. No. 6,229,161, which is fully incorporated herein by reference. Such modifications and changes do not depart from the true spirit and scope of the present invention that is set forth in the following claims.

What is claimed is:

1. A semiconductor device comprising:
    a thyristor having a first base region, a second base region, a first emitter region and a second emitter region, the first base region and the first emitter region having a first conductivity, the second base region and the second emitter region having a conductivity opposite to the first conductivity, the first base region and the first emitter region being contiguously adjacent to the second base region, the second emitter region being contiguously adjacent to the first base region;
    a gate positioned over the first base region and offset laterally from the second base region; and
    a first spacer positioned adjacent to the gate and over at least a portion of the second base region.
2. The semiconductor device of claim 1 further comprising a first salicide over one of the first and the second emitter regions.
3. The semiconductor of claim 2 further comprising a second salicide over another of the first and the second emitter regions.
4. The semiconductor of claim 1 further comprising a salicide over the gate.
5. The semiconductor of claim 1 further comprising a second spacer positioned contiguously adjacent to the first spacer.
6. The semiconductor of claim 1 further comprising a salicide block layer covering at least a portion of the gate and the first spacer.
7. The semiconductor of claim 1 wherein the first base region and the first emitter is doped with an N-type dopant and the second base region and the second emitter region is doped with a p-type dopant.

* * * * *